(12) United States Patent
Hwang

(10) Patent No.: US 8,661,801 B2
(45) Date of Patent: Mar. 4, 2014

(54) THERMOELECTRIC GENERATOR OF VEHICLE

(75) Inventor: Dea-Gil Hwang, Suwon-shi (KR)

(73) Assignee: Hyundai Motor Company, Seoul (KR)

( * ) Notice: Subject to any disclaimer, the term of this patent is extended or adjusted under 35 U.S.C. 154(b) by 88 days.

(21) Appl. No.: 13/477,809

(22) Filed: May 22, 2012

(65) Prior Publication Data

US 2013/0152560 A1    Jun. 20, 2013

(30) Foreign Application Priority Data

Dec. 15, 2011 (KR) ........................ 10-2011-0135371

(51) Int. Cl.
    *F01N 3/00*       (2006.01)
    *F01N 3/02*       (2006.01)
    *F01N 3/20*       (2006.01)
    *H01L 35/30*     (2006.01)

(52) U.S. Cl.
    USPC ................................ 60/320; 60/324; 136/205

(58) Field of Classification Search
    USPC ..................... 60/320, 324; 136/205
    See application file for complete search history.

(56) References Cited

U.S. PATENT DOCUMENTS

| | | | |
|---|---|---|---|
| 7,610,993 B2 | 11/2009 | Sullivan | |
| 7,921,640 B2 * | 4/2011 | Major | 60/320 |
| 2010/0186399 A1 * | 7/2010 | Huttinger | 60/320 |
| 2010/0186422 A1 | 7/2010 | Yang et al. | |
| 2011/0308560 A1 * | 12/2011 | Arbuckle et al. | 136/205 |

FOREIGN PATENT DOCUMENTS

| | | |
|---|---|---|
| EP | 2 180 534 A1 | 4/2010 |
| JP | 2005-223131 A | 8/2005 |
| JP | 2006-314180 A | 11/2006 |
| JP | 2007-37319 A | 2/2007 |
| JP | 2007-154698 A | 6/2007 |
| JP | 2007-210561 A | 8/2007 |
| JP | 2007-236122 A | 9/2007 |
| JP | 2008-189162 A | 8/2008 |
| JP | 2009-278767 A | 11/2009 |
| JP | 2010-245265 A | 10/2010 |
| KR | 10-2011-0010782 A | 2/2011 |

* cited by examiner

*Primary Examiner* — Thomas Denion
*Assistant Examiner* — Dapinder Singh
(74) *Attorney, Agent, or Firm* — Morgan, Lewis & Bockius LLP

(57) ABSTRACT

A thermoelectric generator apparatus of a vehicle, may include a high temperature member installed on an external wall of the exhaust pipe inside a silencer of the vehicle and exchanging heat with the exhaust gas, a low temperature member installed on the external wall of the exhaust pipe and at a side of the high temperature member, and a thermoelectric module formed by joining a P-shaped semi-conductor and an N-shaped semi-conductor, wherein the thermoelectric module may be installed on the external wall of the exhaust pipe between the high temperature member and the low temperature member so that a side thereof may be heated by the high temperature member and the other side thereof may be cooled by the low temperature member in order to use a thermoelectric phenomenon caused by a temperature difference between the side and the other side of the thermoelectric module to generate electricity.

5 Claims, 2 Drawing Sheets

THERMOELECTRIC GENERATOR OF VEHICLE

CROSS-REFERENCE TO RELATED APPLICATION

The present application claims priority to Korean Patent Application No. 10-2011-0135371, filed on Dec. 15, 2011, the entire contents of which is incorporated herein for all purposes by this reference.

BACKGROUND OF THE INVENTION

1. Field of the Invention

The present invention relates to a thermoelectric generator of vehicle, and more particularly, to a thermoelectric generator of vehicle, which uses the heat of the exhaust gas of an automobile to generate electricity.

2. Description of Related Art

A thermoelectric element is an element, which uses a thermoelectric phenomenon, in which thermal energy is converted to electric energy by converting the temperature gap between the two ends of an element into electricity, or in which electric energy is converted to thermal energy by having electricity run through an element and by causing the temperature gap in the two ends. Such thermoelectric element is used in a small scale cooling, heating or generating device.

When a thermoelectric element is used in a small scale generating device, it is called a thermoelectric generation device or a thermoelectric generator. This device is mainly used in a power supply unit of a wireless communication device, of a spaceship and of a nuclear-powered submarine as well as in a thermoelectric generator installed in an exhaust system of a vehicle.

FIG. 1 is a cross-sectional view illustrating a thermoelectric generator of a vehicle.

As illustrated, a thermoelectric generator installed in an exhaust system of a vehicle 10 comprises; a hexagonal exhaust heat recovering device 40, which high-temperature exhaust gas passes through; a cooling device 30, which is installed outside of the exhaust heat recovering device 40 and inside of which coolant passes through; and the multitude of thermoelectric modules 20, which are in contact with the exterior of the exhaust heat recovering device 40 and with the interior of the cooling device 30 to generate electricity using the temperature gap between the two ends.

Inside the exhaust heat recovering device 40, high-temperature exhaust gas runs and it conveys thermal energy to the thermoelectric modules 20. Inside the cooling device 30 is formed a cooling pipe, which increases the temperature gap between the interior of the thermoelectric modules 20 in contact with the exhaust heat recovering device 40 and the exterior of the thermoelectric modules 20 in contact with the cooling device 30. As the temperature gap between the interior and the exterior of the thermoelectric module increases 20, the efficiency of the thermoelectric generator installed in the exhaust system of a vehicle increases.

In order to generate lots of electricity in a thermoelectric generator, i.e. to increase the thermoelectric generation efficiency, thermal energy of the exhaust gas must be conveyed to the thermoelectric modules efficiently. However, in the traditional thermoelectric generator of a vehicle, thermal energy of the exhaust gas is not conveyed to the high temperature member sufficiently, so the recovery rate of the thermal energy of the exhaust gas drops and hence, the thermoelectric efficiency of a thermoelectric generator drops.

Also, in the traditional thermoelectric generator of a vehicle, although a cooling device 30 occupies a great area, the heat-exchange area is small, and therefore, the heat conveyance rate is low compared to the size, and the efficiency of thermoelectric generation is low.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a small thermoelectric generator of a vehicle, with the improved efficiency of the thermoelectric generation.

The technical problems that the present invention is set out to solve are not limited to the ones mentioned above, and those that are not mentioned shall be clearly understood by a person skilled in the art from looking at the specification of the present invention.

In an aspect of the present invention, a thermoelectric generator apparatus of a vehicle may include a high temperature member, through which an exhaust pipe is mounted, wherein an exhaust gas emitted from an engine runs through the exhaust pipe, and, wherein the high temperature member is installed on an external wall of the exhaust pipe inside a silencer of the vehicle and exchanges heat with the exhaust gas, a low temperature member, which is installed on the external wall of the exhaust pipe and at a side of the high temperature member, and through which a coolant runs, and a thermoelectric module formed by joining a P-shaped semiconductor and an N-shaped semi-conductor, wherein the thermoelectric module is installed on the external wall of the exhaust pipe between the high temperature member and the low temperature member so that a side thereof is heated by the high temperature member and the other side thereof is cooled by the low temperature member in order to use a thermoelectric phenomenon caused by a temperature difference between the side and the other side of the thermoelectric module to generate electricity.

The high temperature member may include a first heat exchange plate having a first installation hole, through which the exhaust pipe goes, wherein the first heat exchange plate is installed on the external wall of the exhaust pipe so that an external wall thereof is engaged with an internal wall of the silencer, and a second heat exchange plate having a second installation hole, through which the exhaust pipe goes, wherein the second heat exchange plate is installed on the external wall of the exhaust pipe so that the second heat exchange plate is connected to the first heat exchange plate with a predetermined space therebetween, wherein the first heat exchange plate and the second heat exchange plate are heated by the exhaust gas to heat the side of the thermoelectric module.

The low temperature member may have a third installation hole on a center thereof, through which the exhaust pipe goes, and is installed on the external wall of the exhaust pipe inside the high temperature member, the low temperature member being equipped with a coolant inlet on a side thereof and a coolant outlet on the other side thereof, wherein the coolant flows into the coolant inlet and flows out of the coolant outlet.

The high temperature member may include a first heat exchange plate and a second heat exchange plate, and the thermoelectric module may include a first thermoelectric element mounted on the external wall of the exhaust pipe and contacting internal walls of the first heat exchange plate and the low temperature member, wherein the first thermoelectric element may include a fourth installation hole through which the exhaust pipe penetrates so that a side thereof is heated by the first heat exchange plate and the other side thereof is cooled by the low temperature member to generate electricity using the thermoelectric phenomenon caused by a temperature difference between the lower temperature member and the first heat exchange plate, and a second thermoelectric element mounted on the external wall of the exhaust pipe and contacting internal walls of the second heat exchange plate and the low temperature member, wherein the second thermoelectric element may include a fifth installation hole through which the exhaust pipe penetrates so that a side thereof is heated by the second heat exchange plate and the other side thereof is cooled by the low temperature member, to generate electricity using the thermoelectric phenomenon caused by the temperature difference between the lower temperature member and the second heat exchange plate, and wherein the low temperature member lies between the first thermoelectric element and the second thermoelectric element, and the first thermoelectric element and the second thermoelectric element lie between the first heat exchange plate and the second heat exchange plate.

The first heat exchange plate and the second heat exchange plate, which are combined with the silencer are made of the baffles located inside of the silencer so as to reduce the noise inside the silencer and at the same time to heat up a side of the thermoelectric module to generate electricity.

According to a thermoelectric generator of a vehicle of the present invention, by having the thermoelectric modules, which generate electricity, contact the exhaust gas directly, the thermoelectric efficiency can be maximized.

By being installed inside the silencer of a vehicle, a thermoelectric generator of a vehicle of the present invention can both reduce the noise of the exhaust gas and absorb thermal energy of the exhaust gas at the same time.

Moreover, since the cross section of a baffle is large, the contact area between the exhaust gas and coolant is increased and the thermoelectric efficiency is improved.

Also, a thermoelectric generator of a vehicle of the present invention is small in size, it has advantages in being packaged, and its structure is simple so it can crease the productivity.

Furthermore, the heat conductivity of a thermoelectric generator of a vehicle of the present invention is high, so the number of thermoelectric modules used is small, and hence, the manufacture cost can be reduced and the its overall weight can be reduced as well.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
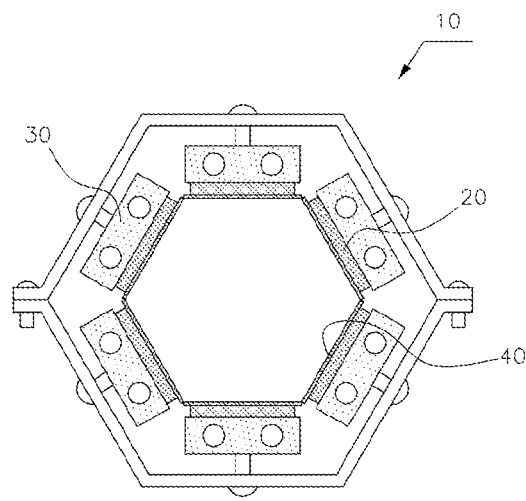
FIG. 1 is a cross sectional view of a traditional thermoelectric generator of a vehicle.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereafter, with reference to the attached drawings, the preferred embodiment of the present invention will be described in detail. Before proceeding, it should be noted that the terminologies and words used on this specification and in the claims are not to be interpreted solely as the general or dictionary meanings, and they should be interpreted as the meanings and the concept which correspond with the technological ideas of the present invention based on the principle that the inventor can properly define the concept of the terminologies in order to explain his own invention in the best possible way. Therefore, the compositions described in the embodiments and the drawings of this specification are merely the most preferred types of embodiment and they do not represent the entire technological ideas of the present invention, and thus, it should be understood that there can be a variety of equivalents and alterations, which can replace these embodiments at the time of filing this application.

Figure 2:
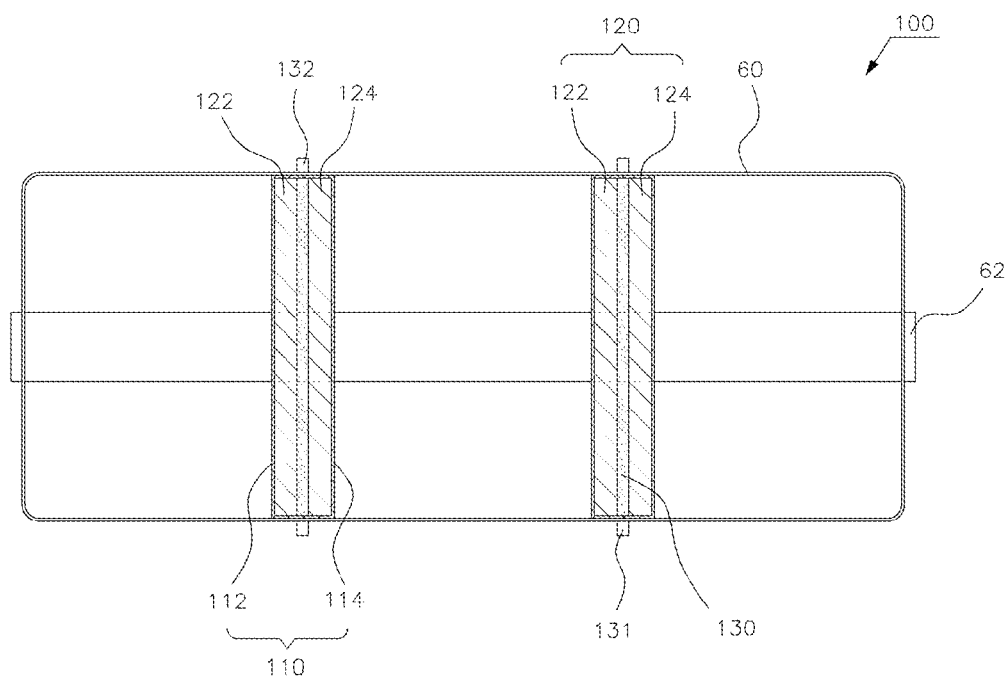
FIG. 2 is a cross sectional view of a thermoelectric generator of a vehicle installed inside a silencer of a vehicle according to an exemplary embodiment of the present invention.
Figure 3:
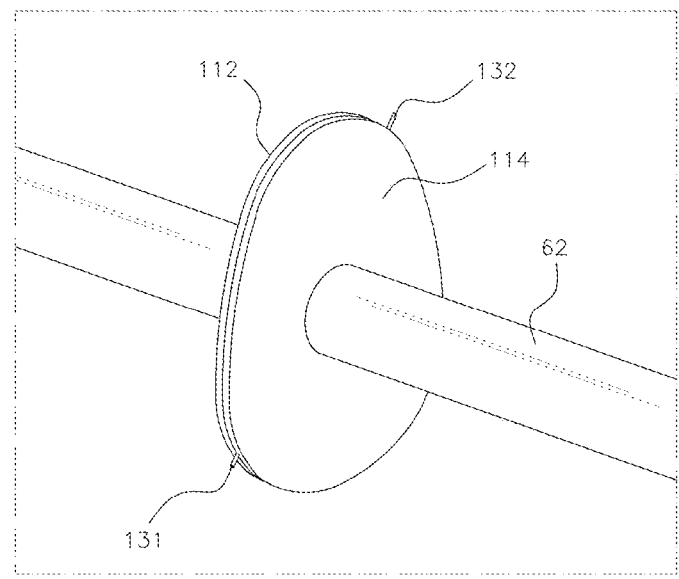
FIG. 3 is a partial perspective view of a thermoelectric generator of a vehicle being installed inside a silencer of a vehicle according to an exemplary embodiment of the present invention.
Figure 4:
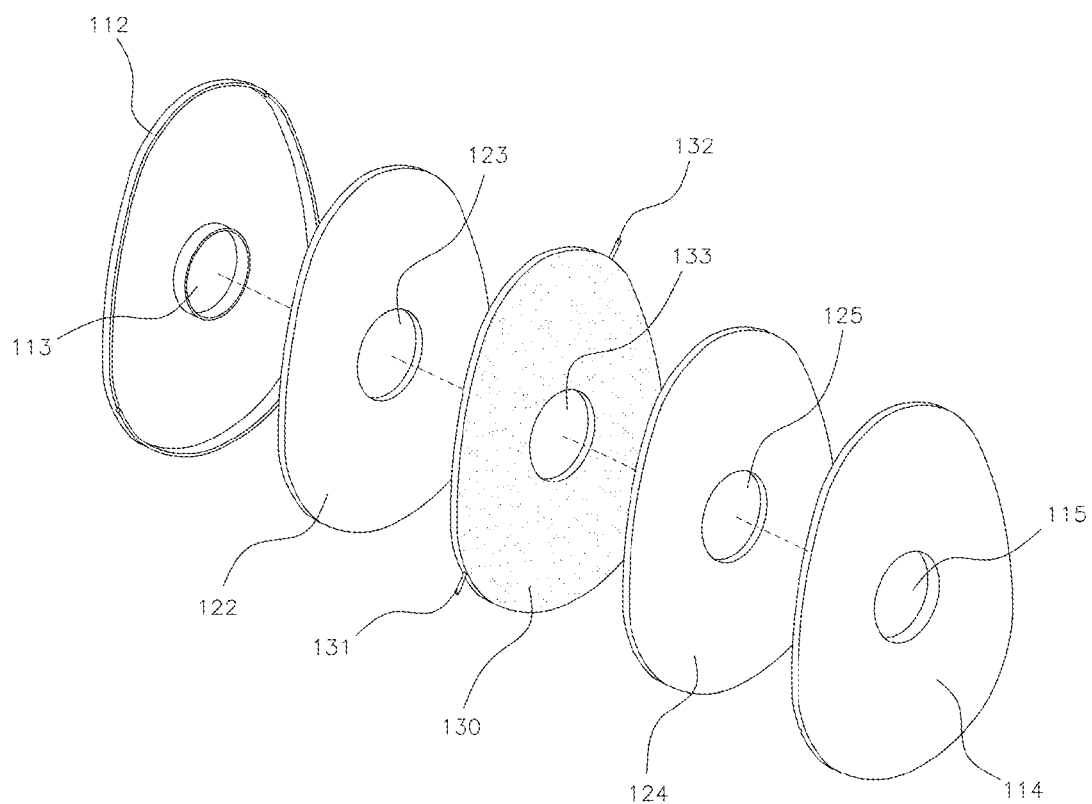
FIG. 4 is an exploded perspective view of a thermoelectric generator of a vehicle according to an exemplary embodiment of the present invention.

FIG. 2 is a cross sectional view of a thermoelectric generator 100 of a vehicle installed inside a silencer of a vehicle according to an exemplary embodiment of the present invention. FIG. 3 is a partial perspective view of a thermoelectric generator 100 of a vehicle being installed inside a silencer of a vehicle according to an exemplary embodiment of the present invention. FIG. 4 is an exploded perspective view of a thermoelectric generator 100 of a vehicle according to an exemplary embodiment of the present invention.

As illustrated, a thermoelectric generator 100 of a vehicle according to an exemplary embodiment of the present invention includes a high temperature member 110 installed on an exhaust pipe 62 penetrating the inside of a silencer of a vehicle 60, a low temperature member 130 which is installed inside the high temperature member 110, and inside of which runs coolant, and thermoelectric modules 120, which lie between the high temperature member 110 and the low temperature member 130 and generate electricity.

The high temperature member 110 includes a first heat exchange plate 112 installed on the external wall of the exhaust pipe 62 and a second heat exchange plate 114 installed on the external wall of the exhaust pipe 62 at a fixed distance from the first heat exchange plate 112.

On the center of the first heat exchange plate 112 is formed a first installation hole 113, and on the center of the second heat exchange plate 114 is formed a second installation hole 115, and the first and the second heat exchange plates 112, 114 are installed on the external wall of the exhaust pipe 62 at a fixed distance apart, and the external wall of the first and the second heat exchange plates 112, 114 is coupled to the internal wall of the silencer 60.

The first and the second heat exchange plates 112, 114 are heated by the high-temperature exhaust gas which runs inside the silencer 60. The heated first and second heat exchange plates 112, 114 heat up the external wall of the thermoelectric modules 120, and thermal energy of the exhaust gas is conveyed to the thermoelectric modules 120.

The low temperature member 130 lies between the first and second heat exchange plates 112, 114, and a coolant inlet 131 is formed on one side of the external wall, and a coolant outlet 132, through which the coolant is emitted from the low temperature member 130, is formed on the other side of the external wall. On the center of the low temperature member 130 is formed a third installation hole, which has the same size as the first and second installation holes 113, 115. The external wall of the low temperature member 130 is coupled to the internal wall of the silencer 60 as in the case of the heat exchange plates 112, 114 of the high temperature member 110.

While the coolant circulating the engine cooling system flows into the low temperature member 130 through the coolant inlet 131 and flows out of the low temperature member 130 through the coolant outlet 132, it cools down the thermoelectric modules 120. As the coolant runs inside the low temperature member 130 and cools down the thermoelectric modules 120, a temperature difference occurs on the internal and external wall of the thermoelectric modules 120.

Meanwhile, the thermoelectric modules 120 lie between the high temperature member 110 and the low temperature member 130. The thermoelectric modules 120 include a first thermoelectric element 122, of which the external wall is in contact with the internal wall of the first heat exchange plate 112 of the high temperature member 110, and a second thermoelectric element 124 of which the external wall is in contact with the internal wall of the second heat exchange plate 114 of the high temperature member 110. The first and second thermoelectric elements 122, 124 are formed by joining a P-shaped semiconductor and an N-shaped semiconductor. The external wall of the first and second thermoelectric elements 122, 124 is the internal wall of the silencer 60, as in the case of the first and second heat transfer plate and the low temperature member 130. On the center of the first and second thermoelectric elements are formed the fourth and fifth installation holes 123, 125, which have the same size as the first, second and third installation holes 113, 115, 133, and they are installed on the external wall of the exhaust pipe 62.

For efficient heat conducting, the first and second thermoelectric elements 122, 124 are attached to the first and second heat exchange plates 112, 114 and the low temperature member 130 by welding or adhesive tapes. Being installed this way, the external wall of the first thermoelectric element 122 and the external wall of the second thermoelectric element 124 are heated by the internal wall of the first heat exchange plate 112 and the internal wall of the second heat exchange plate 124. Meanwhile, the internal walls of the first and second thermoelectric elements are cooled by the low temperature member 130. This way, a temperature difference occurs between the internal walls and the external walls of the first and second thermoelectric elements 122, 124, and this temperature difference causes the thermoelectric phenomenon inside the first and second thermoelectric elements 122, 124, which generates electricity. The thermoelectric elements 122, 124 are electrically connected to each other and they are also connected to a vehicle's battery not illustrated so they charge the battery.

A thermoelectric generator 100 of a vehicle according to an exemplary embodiment of the present invention having the composition as above can be installed in multitude inside the silencer 60. If a multitude of a thermoelectric generator of a vehicle 110 is installed inside a silencer 60, more electricity can be generated, the engine's fuel efficiency increased and the noise reduced.

Now, the applications of a thermoelectric generator of a vehicle according to an exemplary embodiment of the present invention explained above will be explained.

When the engine runs, the exhaust gas is emitted from the engine, and it flows into the silencer 60 through the exhaust pipe 62, and at the same time coolant flows into the low temperature member 130 through the coolant inlet 131 of the low temperature member 130.

The high temperature exhaust gas which flows into the silencer 60 heats up the high temperature member 110 and the first and the second heat exchange plates 112, 114, and the external wall of the first and second thermoelectric elements 122, 124 of the thermoelectric modules 120 is heated by the first and second heat exchange plates 112, 114.

Meanwhile, the coolant, which flows into the low temperature member 130 cools down the internal wall of the first and second thermoelectric elements 9122, 124, which is in contact with the external wall of the low temperature member 130. Hence, a temperature difference occurs between the internal and the external walls of the first and second thermoelectric elements 122, 124. The temperature difference helps generate electricity inside the first and second thermoelectric elements 122, 124. The generated electricity is used to charge the vehicle's batteries.

Inside the silencer 60, the noise of the exhaust gas is reduced as it heats up the high temperature member 110, and the exhaust gas is emitted from the silencer 60 through the exhaust pipe 62. The coolant, which cools down the thermoelectric modules 120 as it flows inside the low temperature member 130, is emitted from the low temperature member 130 through the coolant outlet 132 formed at the low temperature member 130 and returns to the cooling system.

Especially, according to an exemplary embodiment of the present invention, the first heat exchange plate and the second heat exchange plate, which are combined so that their external wall is the internal wall of the silencer, can be composed of the baffles located inside the silencer, and the actions of the baffles accordingly help reduce the noise inside the silencer. Especially, if necessary, the size and the position of the first heat exchange plate and the second heat exchange plate composed of the baffles can be altered properly in order to effectively reduce the noise generated.

Also, as explained above, the actions of the baffles inside the silencer can help reduce the noise and at the same time, the first heat exchange plate and the second heat exchange plate are respectively in contact with the both sides of the thermoelectric modules and act as the high temperature member heating up the thermoelectric modules, and together with the low temperature member, inside of which coolant flows, this can help generated electricity through the thermoelectric generation. Hence two effects of noise reduction and the thermoelectric generation can be achieved.

Furthermore, a thermoelectric generator of a vehicle according to an exemplary embodiment of the present invention is installed in the silencer of the vehicle and helps reduce the installation space. At the same time, it prevents the loss of the thermal energy of the exhaust gas by absorbing the thermal energy of the exhaust gas, and therefore, the efficiency is increased.

In addition, the number of parts is smaller for the vehicle, and hence, the manufacture cost can be saved. The structure is simpler so productivity is increased, and the fuel efficiency of the engine is improved as well.

For convenience in explanation and accurate definition in the appended claims, the terms "upper", "lower", "inner" and "outer", are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A thermoelectric generator apparatus of a vehicle, comprising:
    a high temperature member, through which an exhaust pipe is mounted, wherein an exhaust gas emitted from an engine runs through the exhaust pipe, and, wherein the high temperature member is installed on an external wall of the exhaust pipe inside a silencer of the vehicle and exchanges heat with the exhaust gas;
    a low temperature member, which is installed on the external wall of the exhaust pipe and at a side of the high temperature member, and through which a coolant runs; and
    a thermoelectric module formed by joining a P-shaped semi-conductor and an N-shaped semi-conductor, wherein the thermoelectric module is installed on the external wall of the exhaust pipe between the high temperature member and the low temperature member so that a side thereof is heated by the high temperature member and the other side thereof is cooled by the low temperature member in order to use a thermoelectric phenomenon caused by a temperature difference between the side and the other side of the thermoelectric module to generate electricity.

2. The thermoelectric generator apparatus of the vehicle according to claim 1, wherein the high temperature member includes:
    a first heat exchange plate having a first installation hole, through which the exhaust pipe goes, wherein the first heat exchange plate is installed on the external wall of the exhaust pipe so that an external wall thereof is engaged with an internal wall of the silencer; and
    a second heat exchange plate having a second installation hole, through which the exhaust pipe goes, wherein the second heat exchange plate is installed on the external wall of the exhaust pipe so that the second heat exchange plate is connected to the first heat exchange plate with a predetermined space therebetween,
    wherein the first heat exchange plate and the second heat exchange plate are heated by the exhaust gas to heat the side of the thermoelectric module.

3. The thermoelectric generator apparatus of the vehicle according to claim 1,
    wherein the low temperature member has a third installation hole on a center thereof, through which the exhaust pipe goes, and is installed on the external wall of the exhaust pipe inside the high temperature member, the low temperature member being equipped with a coolant inlet on a side thereof and a coolant outlet on the other side thereof, and
    wherein the coolant flows into the coolant inlet and flows out of the coolant outlet.

4. The thermoelectric generator apparatus of the vehicle according to claim 1, wherein
    the high temperature member includes a first heat exchange plate and a second heat exchange plate; and
    the thermoelectric module includes:
        a first thermoelectric element mounted on the external wall of the exhaust pipe and contacting internal walls of the first heat exchange plate and the low temperature member, wherein the first thermoelectric element includes a fourth installation hole through which the exhaust pipe penetrates so that a side thereof is heated by the first heat exchange plate and the other side thereof is cooled by the low temperature member to generate electricity using the thermoelectric phenomenon caused by a temperature difference between the lower temperature member and the first heat exchange plate; and
        a second thermoelectric element mounted on the external wall of the exhaust pipe and contacting internal walls of the second heat exchange plate and the low temperature member, wherein the second thermoelectric element includes a fifth installation hole through which the exhaust pipe penetrates so that a side thereof is heated by the second heat exchange plate and the other side thereof is cooled by the low temperature member, to generate electricity using the thermoelectric phenomenon caused by the temperature difference between the lower temperature member and the second heat exchange plate, and
    wherein the low temperature member lies between the first thermoelectric element and the second thermoelectric element, and the first thermoelectric element and the second thermoelectric element lie between the first heat exchange plate and the second heat exchange plate.

5. The thermoelectric generator apparatus of the vehicle according to claim 2, wherein the first heat exchange plate and the second heat exchange plate, which are combined with the silencer are made of the baffles located inside of the silencer so as to reduce the noise inside the silencer and at the same time to heat up a side of the thermoelectric module to generate electricity.

* * * * *